United States Patent [19]

Sato et al.

[11] Patent Number: 4,724,342
[45] Date of Patent: Feb. 9, 1988

[54] PUSH-PULL DCFL DRIVER CIRCUIT

[75] Inventors: Robert N. Sato, Palos Verdes Estates; Eugene R. Worley, Irvine, both of Calif.

[73] Assignee: Hughes Aircraft Company, Los Angeles, Calif.

[21] Appl. No.: 828,724

[22] Filed: Feb. 12, 1986

[51] Int. Cl.⁴ .......................................... H03K 19/017
[52] U.S. Cl. .................................... 307/450; 307/448; 307/304; 357/22
[58] Field of Search ............... 307/450, 448, 304, 446; 357/15, 22

[56] References Cited

U.S. PATENT DOCUMENTS 3,775,693  11/1973  Proebsting ........................... 307/450
4,038,563  7/1977   Zulee et al. ......................... 307/450

OTHER PUBLICATIONS

Liechti, "GaAs FET Logic"; *Proc. of 6th Int'l Symposium on GaAs & Related Compounds* (Scotland); (Sep. 20–22, 1976); pp. 227–236.
Tung et al, "High-Speed Low-Power DCFL Using Planar Two-Dimensional Electron GAS FET Technology"; *Electronics Letter* (Jun. 10, 1982), vol. 18, No. 12, pp. 517–519.
Zuleeg et al, "Femtojoule High-Speed Planar GaAs E-JFET Logic"; *IEEE Trans. on Electron Devices*, vol. ED-25, No. 6, pp. 628–639; 6/1978.
Tung et al, "High-Speed Two-Dimensional Electron-GAS FET Logic"; *Electronics Letter* (2/4/1982); vol. 18, No. 3; pp. 109–110.
Le Brun et al, "Monolithic Microwave Amplifier Using a Two-Dimentional Electron GAS FET A Comparison with GaAs"; *GaAs IC Symposium;* Technical Digest, 1983; pp. 20–23; Oct. 25–27, 1983.
Lehovec et al, "Analysis of GaAs FET's for Integrated Logic"; IEEE Trans. on Electron Devices, vol. ED-27, No. 6, pp. 1074–1091; 6/1980.
"Introduction to VLSI Systems", Carver Mead and Lynn Conway, published by Addison-Wesley Publishing Company, Oct. 1980.

*Primary Examiner*—Stanley D. Miller
*Assistant Examiner*—D. R. Hudspeth
*Attorney, Agent, or Firm*—Ronald L. Taylor; A. W. Karambelas

[57] ABSTRACT

An improved driver circuit for an integrated gate circuit using Gallium Arsenide direct coupled FET logic. The push-pull driver circuit generally comprises an enhancement mode voltage follower transistor for driving a load during a first logic transition, and an enhancement mode pull-down transistor for driving this load during a second logic transition. Since only one of these transistors are conductive during these logic transitions (i.e., LO to HI, and HI to LO), little or no static current flows through these transistor means during steady state conditions. Thus, particularly for large capacitive loads, the driver circuit will be considerably faster than conventional DCFL technology, while not causing a significant increase in the power consumed by the push-pull driver circuit.

5 Claims, 4 Drawing Figures

PUSH-PULL DCFL DRIVER CIRCUIT

TECHNICAL FIELD

The present invention relates generally to Gallium Arsenide ("GaAs") integrated circuits ("ICs") using direct coupled FET logic ("DCFL") characterized by high speed, low power digital ICs, and particularly to an improved driver circuit for such ICs.

BACKGROUND OF THE INVENTION

Radiation hardened, high speed, low power very large or large scale integrated ("VLSI/LSI") IC chips are essential to the realization of certain military and other special purpose signal and data processing systems. Among semiconductor VLSI/LSI IC technoligies under consideration for such applications are GaAs E/D-MESFETs, JFETs and HEMTs. The term E/D-MESFET is an acronym for Enhancement/Depletion-Mode Metal Semiconductor Field Effect Transistor, the term JFET is an acronym for Juntion Field Effect Transistor, and the term E/D-HEMT is an acronym for High Electron Mobility Transistor. GaAs E/D-MESFETs, JFETs and HEMTs have certain advantages over silicon semiconductor technologies that make them desirable from a design standpoint. Principally, GaAs has an electron mobility which is several times higher than that of silicon, and its electron drift velocity is also faster than that of silicon. These high-electron mobility and fast drift velocity advantages permit lower power dissipation, and enables information to be transferred at faster rates.

However, there are other factors which need to be addressed in order for GaAs VLSI/LSI IC technology to mature. For example, the gate integration of D-MESFET buffer FET logic (BFL) IC chips is severely constrained by several considerations. These considerations include excessive standby power dissipation, the voltage shift network needed to apply the proper logic level to the following gate, and the need for both positive and negative power supply voltages to operate the gate circuit. Similarly, with regard to E-MESFETs, difficulties have been experienced in the past, particularly in controlling threshold voltage and the resistence between the gate and source.

However, as these problems for E-MESFETs are overcome with improved fabrication techniques and with improved materials, E-MESFETs will be better suited to the realization of VLSI/LSI IC chips than D-MESFETs. This is because E-MESFETs exhibit much lower standby power dissipation than D-MESFETs. Indeed, the standby power dissipation of an E-MESFET DCFL is almost an order of magnitude lower than a D-MESFET BFL. Additionally, E-MESFET DCFLs do not require both positive and negative power supply voltages, as do BFLs. Rather, only a single power supply voltage is needed in order for an E-MESFET DCFL to operate in an IC chip. While the operating speed of an E-MESFET is compatible with the operating speed of a D-MESFET, the speed-power product of the gate and a level of gate integration per chip are more determinative factors when considering which of these MESFET technologies to use.

It is a principal objective of the present invention to provide an improved driver circuit for a DCFL gate circuit which employs GaAs MESFET, JFET and/or HEMT technology in a way which will achieve a significant reduction in the speed-power product of the gate. Such a lower-speed power product will allow DCFL integrated circuits to handle more data at higher speeds, enable more gates to be integrated per chip, and permit the gates to drive larger loads. For example, one of the advantages of the present invention is that the push-pull driver circuit will dissipate lower static power while maintaining approximately the same operating clock speed, or where a higher clock speed is desirable, the push-pull driver circuit will exhibit a faster operating clock speed while maintaining approximately the same static power dissipation as conventional driver circuits.

Particularly with respect to large output loads, the propagation delay time of a push-pull driver circuit in accordance with the present invention will be noticably superior to that of conventional driver circuits. Additionally, an enhanced driving capability is also achieved according to the present invention, because the buffer geometry is increased without causing a significant increase of the gate static power dissipation. It should also be noted that the push-pull driver circuit will be capable of driving a transmission line interface with other compatible IC chips.

A related circuit technique has been applied to silicon N-channel MOS and Transistor-Transistor Logic ("TTL") technologies. For example, a super buffer inverter circuit is disclosed in the "Introduction To VLSI Systems", by Carver Mead and Lynn Conway, pp. 17–18, the Addison-Wesley Publishing Co., 1980. However, the design and operational considerations for the MESFET, JFET and HEMT technologies are substantially different than those for N-channel MOS technology. For example, the power supply voltage for a MESFET circuit has to be limited to prevent D.C. current flow through the gate of the MESFET, whereas such a current flow does not have to be taken into consideration by a MOSFET circuit designer. Additionally, the speed of the operation of a MESFET is two order of magnitude faster than that of MOSFET. The logic swing voltage of a MESFET is also smaller so that noise immunity must be carefully considered.

SUMMARY OF THE INVENTION

To achieve the foregoing objectives, the present invention provides a push-pull driver circuit which generally comprises voltage follower transistor means for driving a load during a first logic transition and pull-down transistor means pulling down this load during a second logic transition. Since the voltage or source follower transistor means and the pull-down transistor means conduct hard only during the appropriate logic transitions (i.e., either LO to HI, or HI to LO at the load), little or no static current flows through these transistor means during steady state conditions. Thus, particularly for a large capacitive load the push-pull driver circuit will be considerably faster than a conventional DCFL driver, while not causing a significant increase in the power consumed by the push-pull driver circuit. This increase in the operating speed is achieved because the voltage follower transistor means will rapidly charge the capacitance in the load during the first logic transition, while the pull-down transistor means will rapidly discharge the capacitance in the load during the second logic transition. Accordingly, it will be appreciated that the driver circuit according to the present invention achieves a significant reduction in the speed-power product of the gate in which it is employed.

It should be noted that the push-pull driver circuit according to the present invention may be used in a variety of other DCFL logic gates, such as inverters, NOR and NAND gates, flip-flops, and so forth. In one form of the present invention, the voltage follower transistor means and the pull-down transistor means are both N-type E/D-MESFETs constructed from gallium arsenide, a III-V compound semiconductor material. However, these transistors could also be constructed in JFET and HEMT technologies, as they are both constructed from GaAs semiconductor material.

Additional advantages and features of the present invention will become apparent from a reading of the detailed description of the preferred embodiments which make reference to the following set of drawings:

DETAILED DESCRIPTION OF THE PREFERRED EMBODIMENTS

Figure 1:
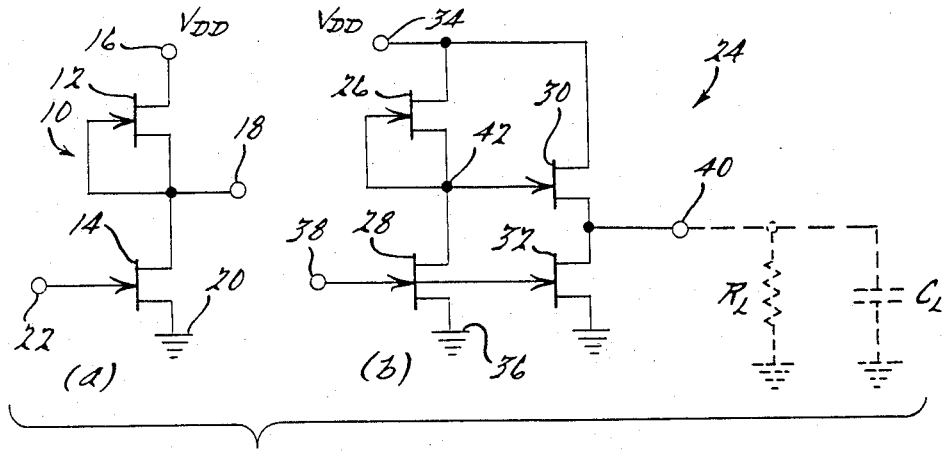
FIG. 1A is a schematic diagram of a conventional inverter using E/D-MESFET DCFL.
FIG. 1B is a schematic diagram of an improved inverter using a driver circuit in accordance with the present invention.

Referring to FIG. 1A, a schematic diagram of a conventional inverter 10 using N-type MESFET DCFL technology is shown. The inverter 10 includes a D-MESFET load transistor 12 and a E-MESFET driver transistor 14. The drain of the load transistor 12 is connected to a positive voltage ($V_{DD}$) terminal 16. The source of the load transistor 12 is connected to a load or output terminal 18. The source of the load transistor 12 is also connected to its gate. The drain of the driver transistor 14 is connected to the load terminal 18, while its source is connected to a ground terminal 20. The gate of the driver transistor 14 is connected to an input signal terminal 22.

As well known, the digital logic state at the output terminal 18 of the inverter 10 will be the opposite of the digital logic state at the input signal terminal 22. Thus, for example, when the input signal received at terminal 22 switches from a LO to a HI logic state, the output of the inverter at terminal 18 will switch from a logic HI state to a logic LO state.

With the gate of the load transistor 12 connected to its source, this D-MESFET transistor is always conducting and serving as a variable resistor and the current flow through this "resistor" will depend upon the voltage between terminal 18 and the terminal 16. Accordingly, when the input signal at terminal 22 is LO, the driver transistor 14 will be in an OFF or nonconductive state, and hence the voltage at terminal 18 will be at a logic HI level. This is because when the driver transistor 14 is OFF, it acts as an open circuit, and the current through the load transistor 12 cannot flow through the driver transistor 14. Accordingly, the voltage at terminal 18 will be very close to the voltage level ($V_{DD}$) at the voltage terminal 16.

However, when the input signal at terminal 22 switches to a HI state, the driver transistor 14 will turn ON, thereby driving the voltage at terminal 18 to a logic LO state or level. This is because when the driver transistor 14 turns on, it will operate as a short circuit and current will flow through the load transistor 12 to the ground terminal 20.

One of the drawbacks to the inverter circuit 10 is that the gate width-to-length ratio of the load transistor 12 has to be large in order to achieve fast logic transition times. This increases the cell geometry and causes more static current to flow through the load transistor 12 when the driver transistor 14 is in a conducting or ON state. Additionally, such a longer gate width for the load transistor 12 tends to cause a large current flow through the gate of the following driver transistor in the IC. Such a longer gate width for the load transistor 12 will also require a large geometry for the driver transistor 14 in order to turn OFF a following similar gate circuit. This is because the channel resistivity of the D-MESFET load transistor 12 is lower. This factor is additionally complicated by the fact that the gate turn-on voltage, or threshold voltage of the driver transistor 14 is very sensitive to the power supply voltage level, the operating environment of the chip, and other transistor parameter variations. In order to increase the fast logic transition capability, the channel width to gate length ratio of both transistors 12 and 14 must be increased. The larger the width is the larger device capacitance becomes. The larger device capacitance causes slowing logic transition and the smaller gate length increases the difficulty of threshold voltage uniformity of the E/D-MESFET.

Referring now to FIG. 1B, a push-pull inverter circuit 24 according to the present invention is shown. The inverter 24 is generally comprised of a D-MESFET load transistor 26, an E-MESFET switching transistor 28, an E-MESFET voltage follower transistor 30, and an E-MESFET pull-down transistor 32. While each of these transistors 26–32 are preferably constructed from N-channel gallium arsenide (GaAs) MESFET technology, these transistors may also be made from GaAs, JFET or HEMT technology as well. Additionally, the push-pull driver circuits according to the present invention may be made from a combination of these two technologies, as both are constructed from GaAs material. It may also be possible for other suitable III–V compounds besides GaAs to be used in the appropriate application.

The drain of the load transistor 26 is connected to the positive voltage supply terminal 34, and the source of this transistor is connected to its gate. The drain of the switching transistor 28 is connected to both the source and the gate of the load transistor 26, while the source of transistor 28 is connected to the ground terminal 36. The gate of the switching transistor 28 is connected to an input signal terminal 38 and the gate of the pull-down transistor 32. The drain of the voltage follower transistor 30 is connected to the voltage terminal 34, and its source is connected to the output terminal 40. The gate of the voltage follower transistor 30 is connected to the gate and source of the load transistor 26, as well as to the drain of the switching transistor 28. This junction or node is generally indicated at the reference numeral 42. The drain of the pull-down transistor 32 is connected to the output or load terminal 40, while its source is connected to the ground terminal 36. The gate of the pull-down transistor 32 is connected to the gate of the switching transistor 28, which is in turn connected to the input terminal 38.

FIG. 1B also shows a load connected to the output terminal 40 which is represented by a load capacitance $C_L$ and a load resistance $R_L$. When the inverter 24 is used as the output buffer to an IC chip, the output can generally be represented by a transmission line termination resistance and capacitance, such as $R_L$ and $C_L$. However, this resistance is typically very low (e.g., on the order of 50–80 ohms). In contrast, when the inverter 24 is used as an internal buffer to the IC chip, the output load (e.g., another gate) may be represented solely by the capacitance $C_L$. Accordingly, the cell geometries for the transistors 30 and 32 will preferably be constructed using different considerations to optimize the design in each of these cases. These cell width considerations will be discussed more fully below.

While the circuit diagrams in FIGS. 1A and 1B appear to indicate that the transistors 26 and 28 are the same as the transistors 12 and 14, this is not the case because the cell geometries for these transistors are different. Thus, for example, the load transistor 26 does not have to drive the full gate capacitance, as the gate-to-drain capacitance presented by the voltage follower transistor 30 is substantially less than its gate capacitance. Furthermore, the voltage or source follower transistor 30 also isolates the load transistor 26 from the external load capacitance $C_L$.

The isolation of the external capacitance $C_L$ from the load transistor 26 will become more effective for increases in the transconductance of the voltage follower transistor 30. This makes it possible to design a smaller load transistor 26 in comparison with the size of the load transistor 12. This reduction in the size of the load transistor 26 will correspondingly reduce the static and dynamic current flow through this transistor, as well as reduce its sensitivity to the power supply voltage, the operating environment, and other transistor parameter variations.

The operation of the push-pull inverter 24 will now be described. When the input signal at terminal 38 switches from a LO to HI logic state, both the switching transistor 28 and pull-down transistor 32 will conduct, and thereby drive the gate of the voltage follower transistor 30 from a HI to a LO logic state. This transition from a HI to a LO logic state at the gate of the voltage follower transistor 30 will cause this transistor to be nonconductive during the transitional period and after the transitional period in which the inverter 24 will be in a steady state condition. Since the gate of the pull-down transistor 32 is connected to the gate of the switching transistor 28, the transistor 32 will conduct very hard during the transition of the input signal from LO to HI. This will cause the pull-down transistor 32 to pull the resistive load $R_L$ down and rapidly discharge the capacitive load $C_L$. In the steady state condition where the output of the inverter 24 is LO, very little current will be drawn by the pull-down transistor 32 as the voltage between its drain and source will be almost the same potential. During this time, the E-MESFET voltage follower transistor 30 will ideally be in an OFF conducting state because the gate to source voltage becomes about the same potential voltage. However, during this time period, current flowing through the load transistor 26 and the switch transistor 28 will remain in a conducting state.

When the input signal at terminal 38 switches from a HI logic state to a LO logic state, the switching transistor 28 will be rendered nonconductive. This will cause the voltage at the gate of the voltage follower transistor 30 to go from a LO to a HI logic state. At the initial condition of this transition, the voltage difference between the gate and the source of the voltage follower becomes large, thereby making more drain current flow through this transistor and causing the voltage follower transistor 30 to turn very hard. It enables the capacitive load $C_L$ to be rapidly charged through the voltage follower transistor 30. At this time, the reduction of the gate to source voltage of the pull-down transistor 32 will cause an OFF condition as its gate will be switched from a HI to LO logic state. Consequently, as the pull-down transistor 32 is being turned OFF, the voltage follower transistor 30 is driving the resistive load $R_L$ and rapidly charging the capacitive load $C_L$ during this logic transition. When the push-pull inverter 24 has reached a steady state condition in which the output of the inverter is HI, very little current will flow through the voltage follower transistor 30, as its gate and source will be almost at the same voltage (i.e., differing by the threshold voltage).

Thus, it should be appreciated from the above that during one logic transition the voltage follower transistor 30 will enable a gate circuit according to the present invention to drive larger external loads at a faster rate. Similarly, during the opposite logic transition, the pull-down transistor 32 will improve the pulling down of the output voltage down achieving a full logic transition time. These two transistors combine to provide a driver circuit which is capable of driving a large capacitive or a terminated transmission line at the fast rate with lower static power dissipation. This, of course, is necessary to achieve very high speed LSI chip-to-chip interfaces. It should also be noted that during non-transition periods, such as when the logic state of the gate is in a steady state condition (either HI or LO), one of the transistors 30–32 will be completely OFF and no static current will flow through that transistor. During such a steady state condition, very little current will flow through the other of these transistors.

Figure 2:
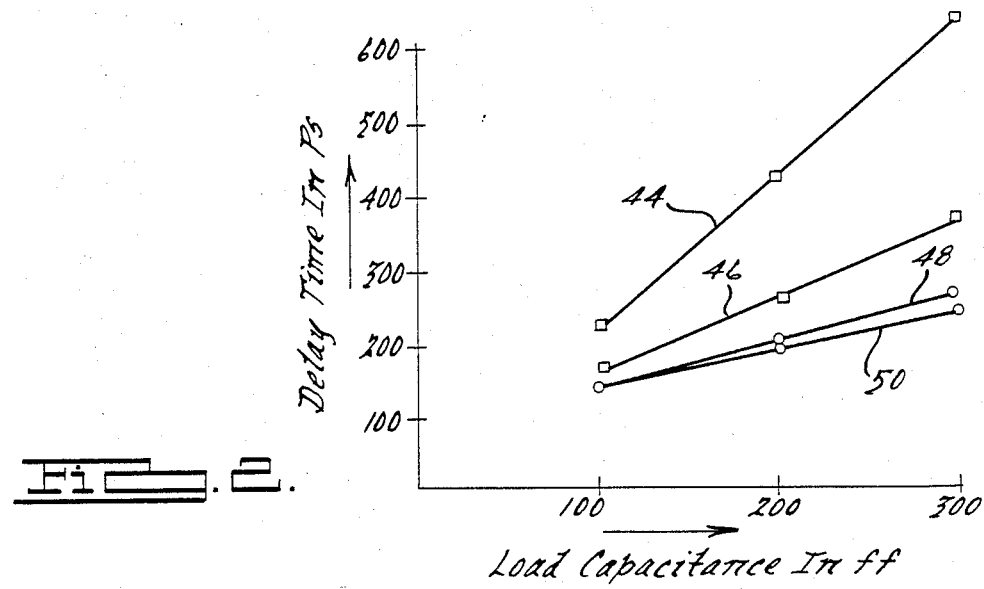
FIG. 2 is a graph illustrating the delay time as a function of load capacitance for the inverters shown in FIGS. 1A and 1B.

An example of the speed-power product savings that can be achieved with the use of a driver circuit according to the present invention is illustrated in FIG. 2. FIG. 2 shows a plot of the delay times versus load capacitance for the circuits shown in FIGS. 1A and 1B. Computer aided simulations were used to generate these plots using the following parameters. Device gate length for inverters 10 and 24 (0.8 micrometers), transistor 12 width (5 micrometers), transistor 14 width (15 micrometers), transistor 26 width (5 micrometers), transistor 28 width (15 micrometers), transistor 30 width (30 micrometers), and transistor 32 width (30 micrometers).

Referring to FIG. 2, curve 44 represents the delay time of the conventional inverter 10 during a LO to HI transition. Similarly, the curve 46 represents the delay time for the conventional inverter 10 during a HI to LO transition. In contrast, the curve 48 represents the delay time for the improved inverter 24 during a LO to HI transition, and the curve 50 represents the delay time for a HI to LO transition of this push-pull inverter. At larger load levels, as shown in FIG. 2, the improved inverter 24 is considerably faster than the conventional inverter 10. It should also be noted that the static power for the conventional inverter 10 was calculated to be 155 (microwatts/gate), while the static power for the improved inverter 24 was calculated to be 146 (microwatts/gate). These static power figures represent average values over a HI input state and a LO input state. Accordingly, it should be appreciated that the delay time-static power product of the improved inverter 24 is considerably lower than that of the conventional converter 10.

Figure 3:
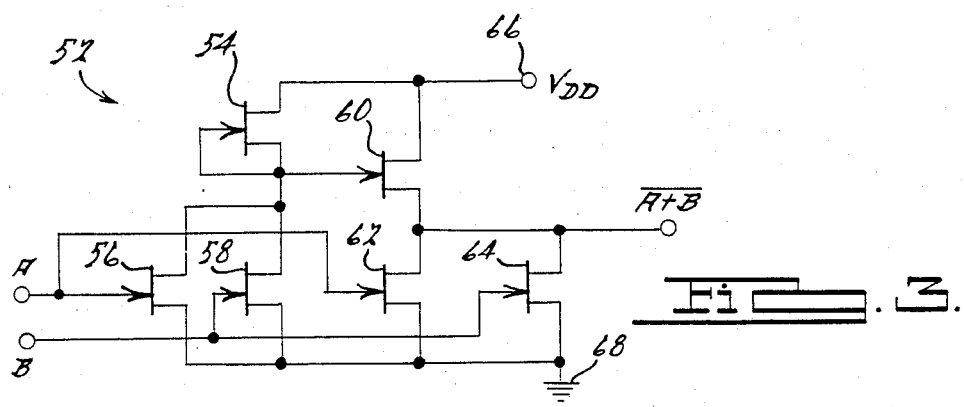
FIG. 3 is a schematic diagram of an improved NOR gate using a push-pull driver circuit in accordance with the present invention.

Referring to FIG. 3, a schematic diagram of an improved NOR circuit 52 is shown. This push-pull NOR circuit 52 generally comprises a D-MESFET load transistor 54, a pair of E-MESFET switching transistors 56–58, an E-MESFET voltage follower transistor 60, and a pair of E-MESFET pull-down transistors 62–64. Generally speaking, the NOR gate 52 has a similar circuit construction in comparison with the push-pull inverter 24. The principal distinctions between these two circuits are that the NOR gate 52 has a pair of switching transistors 56–58 connected in parallel (whereas the inverter 24 only has one switching transistor 28), and that the NOR gate has a pair of pull-down transistors 62–64 connected in parallel (whereas the inverter only has one pull-down transistor 32). These additional transistors in the NOR gate 52 are to permit the addition of a second input signal to the NOR gate. Accordingly, it will be appreciated that the NOR gate 52 will operate during the logic state transitional periods in a similar manner to that described in connection with the inverter 24 of FIG. 1B. It should be appreciated that the inverter and NOR gate circuits described above are only two examples of the possible logic gate applications for a push-pull driver circuit according to the present invention. Thus, for example, a push-pull driver circuit according to the present invention could be used as an output buffer in primitive cell logic gates such as NOR gates, NAND gates, as well flip-flop circuits.

In terms of the cell geometries for the MESFET transistors used in the present invention, such as the transistors 26–32 used in the inverter 24, the principal design consideration of interest is the width of these transistors. This is because the gate length is usually fixed, according to a design rule, so that the designer will generally have an option to change the gate length of this transistor. In order to optimize the performance of the circuit, the designer will have to provide a transistor width which will meet the driving capability required without penalizing the density of the chip or increasing the device capacitance.

The following equation may be used to optimize the width of transistor 26:

$$W_1 = \frac{1}{B_0(V_{gs1} - V_p)^2 \lambda k \, R_{w1}}$$

where
$W_1$ = the width of transistor 26
$V_p$ = the pinchoff voltage
$B_0$ = a scale factor related to mobility, channel depth, and channel length
$\lambda$ = the drain resistance scale factor
$k$ = the saturation point factor
$R_{w1} = V_{DD}^2/P_{w1}$ = channel resistence of transistor 26
$P_{w1}$ = allocated static power dissipation of transistor 26

Additionally, in order to achieve a symmetry in the ability for both transistors 26–28 to drive the load at terminal 42, the following equation may be used:

$$W_2 = AW_1,$$

where
$W_2$ = channel width of transistor 28
$A$ = driving capability ratio factor When the push-pull driver circuit is used as an internal buffer in a chip and driving a large capacitive load $C_L$, the following equations may be used to optimize the width of the transistor 30:

$$W^3 = C_L/\text{gms3}$$

Additionally, when the push-pull driver circuit is used as an output buffer to drive a resistive load, the width of the transistor 30 may be optimized by using the following equation:

$$W = \frac{k}{(1-k) \, \text{gms3} \, R_L}.$$

where
$W_3$ = channel width of transistor 30
$C_L$ = capacitive load
gms3 = transconductance of transistor 30 per unit width
tr = rise time of the output wave at terminal 40
K = the ratio of maximum voltage to minimum voltage
$R_L$ = resistive load When the driver circuit is used as an interval buffer in a chip, the following equations may be used to optimize the width of the transistor 32:

$$W_4 = C_L/\text{gms4} t_f$$

$t_f$ = fall or discharge time of the output wave at terminal 40

$\text{gm}_{s4}$ = transconductance of transistor 32 per unit width at terminal 40

When the driver circuit is used as an output buffer, the following equation may be used for the width of the transistor 32:

$$W_4 = K/\text{gm}_{s4} R_L$$

The various embodiments which have been set forth above were for the purpose of illustration and were not intended to limit the invention. It will be appreciated by those skilled in the art that various changes and modifications may be made to these embodiments described in this specification without departing from the spirit and scope of the invention as defined by the appended claims.

We claim:

1. In a gate circuit using GaAs direct coupled logic, an improved driver circuit, comprising:
    a depletion mode load transistor having its drain connected to a positive voltage terminal, and its gate connected to its source;
    an enhancement mode switching transistor having its drain connected to the source and gate of said load transistor, its source connected to a ground terminal and its gate connected to an input signal terminal;
    an enhancement mode voltage follower transistor having its drain connected to said positive voltage terminal, its source connected to a load terminal, and its gate connected to the gate and source of said load transistor; and an enhancement mode pull-down transistor having its drain connected to said load terminal, its source connected to said ground terminal, and its gate connected to the gate of said switching transistor;

the width of said load transistor being equal to $$1/(B_o(V_{gsl}-V_p)^2 \lambda k R_{w1}),$$

where
- $V_p$ = the pinchoff voltage
- $B_o$ = a scale factor related to mobility, channel depth, and channel length
- $\lambda$ = the drain resistance scale factor
- $k$ = the saturation point factor
- $R_{w1} = V_{DD}^2/P_{w1}$ = channel resistance of said load transistor; and the width of the switching transistor being equal to $AW_1$, where
- $W_1$ = the width of said load transistor
- $A$ = driving capability ratio factor.

2. The invention according to claim 1, wherein said voltage follower transistor, said pull-down transistor and said switching transistor are N-channel enhancement mode MESFETs, and said load transistor is a N-channel depletion mode MESFET.

3. The invention according to claim 1, wherein the width of said voltage follower transistor is equal to $C_L/gms_3 t_r$ and the width of said pull-down transistor is equal to $C_L/gms_4 t_f$ for a capacitive load where
- $C_L$ = capacitive load
- $gms_3$ = transconductance of said voltage follower transistor per unit width
- $t_r$ = rise time of the output wave at said load terminal
- $t_f$ = fall or discharge time of the output wave at said load terminal
- $gms_4$ = transconductance of said pull-down transistor per unit width at said load terminal.

4. The invention according to claim 1, wherein the width of said voltage follower transistor is equal to $K/(1-K\,gms_3\,R_L)$, and the width of said pull-down transistor is equal to $K/(gms_4\,R_L)$ for a resistive load where
- $K$ = the ratio of maximum voltage to minimum voltage
- $R_L$ = resistive load
- $gms_3$ = transconductance of said voltage follower transistor per unit width
- $gms_4$ = transconductance of said pull-down transistor per unit width.

5. The invention according to claim 1, wherein said voltage follower transistor and said pull-down transistor are both High Electron Mobility Transistors (HEMTs).

* * * * *